United States Patent [19]
Young

[11] Patent Number: 5,028,824
[45] Date of Patent: Jul. 2, 1991

[54] PROGRAMMABLE DELAY CIRCUIT

[75] Inventor: William R. Young, Palm Bay, Fla.

[73] Assignee: Harris Corporation, Melbourne, Fla.

[21] Appl. No.: 347,574

[22] Filed: May 5, 1989

[51] Int. Cl.$^5$ .................. H03K 5/13; H03K 5/159
[52] U.S. Cl. ..................... 307/603; 307/268; 307/263; 307/601; 307/356
[58] Field of Search ............ 307/601, 597, 603, 263, 307/268; 328/114

[56] References Cited

U.S. PATENT DOCUMENTS

| | | | |
|---|---|---|---|
| 3,760,280 | 9/1973 | Covington | 307/603 |
| 3,790,821 | 2/1974 | Adamson | 307/268 |
| 4,039,858 | 8/1977 | Stewart | 328/114 |
| 4,620,312 | 10/1986 | Yamashital | 307/603 |
| 4,694,198 | 5/1987 | Umeki | 307/359 |
| 4,694,208 | 9/1987 | Szabo et al. | 307/603 |
| 4,754,477 | 6/1988 | Tanaka et al. | 307/359 |
| 4,812,676 | 3/1989 | Yang et al. | 307/356 |
| 4,833,346 | 5/1989 | Marple | 307/359 |

Primary Examiner—Stanley D. Miller
Assistant Examiner—Richard Roseen
Attorney, Agent, or Firm—Evenson, Wands, Edwards, Lenahan & McKeown

[57] ABSTRACT

A low power programmable delay circuit produces an output pulse having multiple-variable signal characteristics that are independent of power supply functions and wafer processing parameters. The delay circuit employs a timing pulse generator which initiates the generation of a timing pulse in accordance with a prescribed logical combination of an input pulse and a control logic level. The timing pulse generator contains a time constant control circuit that establishes the rate of change of the leading and trailing edges of the timing pulse. The timing pulse is coupled to a Schmitt trigger circuit to produce a pulse having sharply defined leading and trailing edges the times of occurrence of which are determined by the trigger threshold of the Schmitt trigger circuit. This Schitt trigger output pulse is logically combined with the original input signal to produce a programmably delayed output pulse. The Schmitt trigger circuit is preferably comprised of a MOSFET comparator circuit and associated controlled latch voltage reference circuit. The source voltages for each arm of the comparator and those of voltage reference circuit are the logic levels of the digital signals being processed. As a result any fluctuation of the source voltages creates the same differential to both the comparator and the threshold reference networks, so that the Schmitt trigger operates independently of the voltage variation.

38 Claims, 5 Drawing Sheets

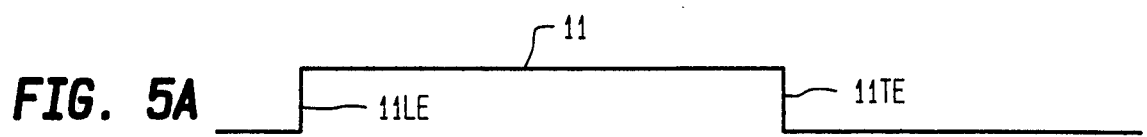
FIG. 5A
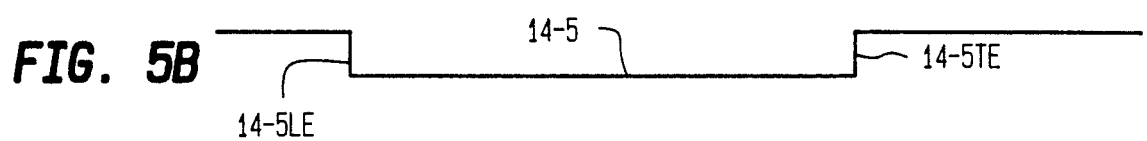
FIG. 5B
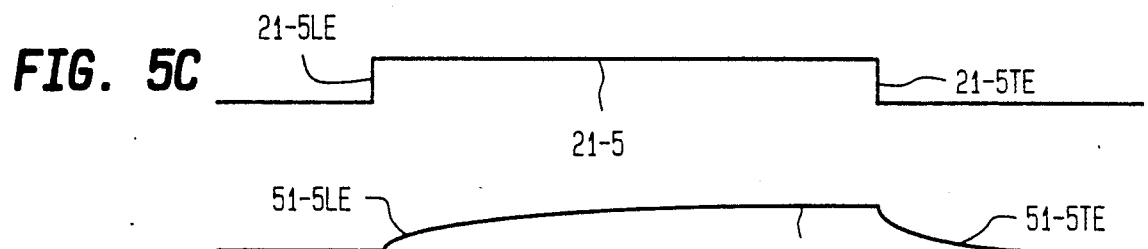
FIG. 5C
FIG. 5D
FIG. 5E
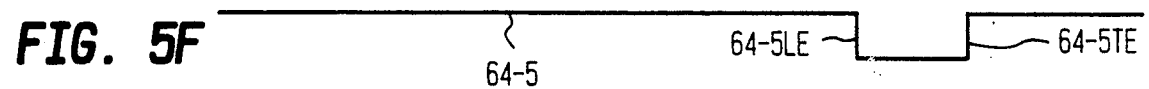
FIG. 5F

PROGRAMMABLE DELAY CIRCUIT

FIELD OF THE INVENTION

The present invention relates to signal processing circuits and is particularly directed to a low standby power digital pulse delay circuit, characteristics of the output pulse of which are programmable and effectively independent of power supply voltage fluctuations, and which minimize circuit performance variations caused by parametric distributions characteristic of integrated circuit wafer processing.

BACKGROUND OF THE INVENTION

Signal processing systems, especially digital data processing systems, commonly employ a reference time clock through which signal/data processing operations throughout the system are controlled. Because of a variety of factors that influence the timing of events within the system, such as the inherent throughput delay of individual circuit components, propagation delays of signal transmission links and processing cycle times, it is usually necessary to incorporate delay circuits in the system, thereby ensuring proper timing relationships among signal transitions.

Typically, the delay element employed comprises either a passive delay network or some form of monostable delay circuit containing a monostable multivibrator and associated logic circuitry. Because the operational characteristics of the monostable device are inherently dependent upon the electronic parameters of its transistors, the timing characteristics of a given integrated circuit design can be expected to differ among signal processing architectures manufactured during different wafer processing runs. Namely, variations in wafer processing parameters can be expected to produce delay circuits having differing timing characteristics from chip-to-chip.

Another drawback of the conventional monostable delay circuit is its dependency on precise power supply levels. Again, because of the operational sensitivities of the circuit's components (i.e. transistors) to an external influence beyond the control of the system designer, performance (e.g. processing speed) of the architecture is limited.

These two drawbacks (sensitivity to processing parameters and power supply variations) have effectively limited the variety of components that may be included in a library of standard cells or components from which the system designer may select to implement increasingly complex, application-tailored signal processing architectures.

SUMMARY OF THE INVENTION

In accordance with the present invention, there is provided a new and improved delay circuit that is capable of producing an output pulse having multiple-variable signal characteristics (leading and trailing edge timing and shape and pulse duration) that are independent of power supply functions and which minimize the variations caused by the parameter distributions which result from wafer processing. To this end the present invention employs a timing pulse generator which initiates the generation of a timing pulse in accordance with a prescribed logical combination of an input pulse and a control logic level. The timing pulse generator contains a time constant control circuit that establishes the rate of change of the leading and trailing edges of the timing pulse. The timing pulse is coupled to a Schmitt trigger circuit to produce a pulse having sharply defined leading and trailing edges the times of occurrence of which are determined by the trigger threshold of the Schmitt trigger circuit. This Schmitt trigger pulse is logically combined with the original input signal to produce a programmably delayed output pulse.

The time of initiation (time of occurrence of leading edge) and duration (time between leading edge and trailing edge) of the delayed output pulse are established by the control logic level and presettable characteristics of the time constant control circuit. The time constant control circuit may comprise a resistor-capacitor circuit or a controlled current source-capacitor circuit.

The Schmitt trigger circuit is preferably comprised of a MOSFET comparator circuit and associated controlled latch voltage reference circuit. One arm of the comparator has a trigger threshold input coupled to a selectively enabled voltage divider network which is coupled between respective logic level voltage inputs. The other ar of the comparator is coupled to the time constant network. Until the voltage divider network is selectively enabled the Schmitt trigger circuit remains in a powered-down state, drawing no current. In response to the logical combination of the input pulse and control input yielding a prescribed logic level, a control switch in the voltage divider network is turned on, thereby placing the trigger reference, derived from the voltage divider network, at the trigger threshold input of the comparator. When the output of the time constant network reaches a voltage corresponding to trigger voltage the Schmitt trigger output changes state. At the same time, the output is used to disable the voltage divider network and put the comparator into a powered down state, drawing no current. The output of the Schmitt trigger remains unchanged until the logical combination of the input pulse and the control input changes state. This change in state transition resets the Schmitt trigger.

Advantageously, the source voltages for each arm of the comparator and those of voltage divider network are the two logic levels of the digital signals being processed. As a result any fluctuation of the source voltages creates the same differential to both the comparator and the threshold reference networks, so that the Schmitt trigger operates independently of the voltage variation.

BRIEF DESCRIPTION OF THE DRAWINGS

FIGS. 4A-4F and 5A-5F are timing diagrams of voltage levels occurring at prescribed parts of a modified embodiment of circuit of FIG. 1.

DETAILED DESCRIPTION

Figure 1:
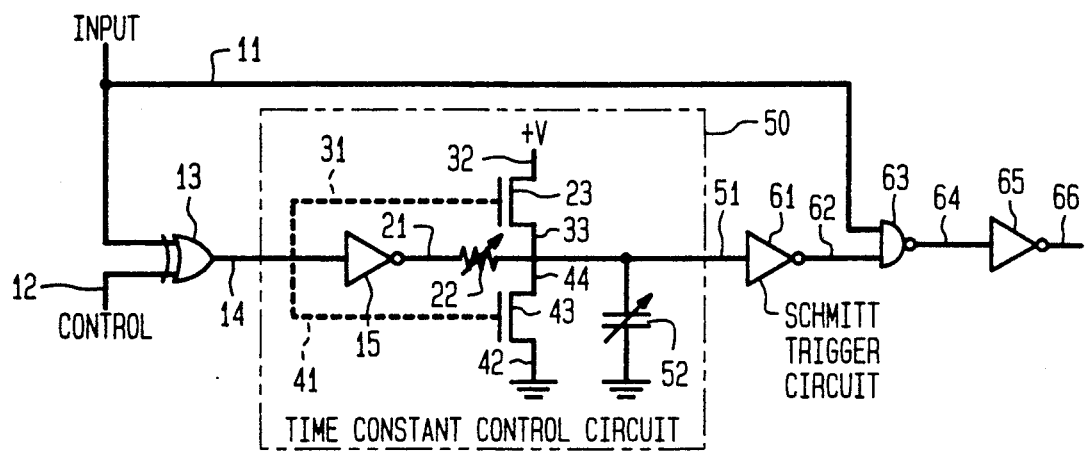
FIG. 1 is a diagrammatic illustration of an embodiment of a programmable delay circuit in accordance with the present invention.

Referring now to FIG. 1, a schematic circuit diagram of an embodiment of the improved delay circuit according to the present invention (which may be comprised of CMOS circuit components) is shown as comprising an input link 11 coupled to one input of an exclusive OR gate 13 and to one input of an NAND gate 63. A second input of exclusive OR gate 13 is coupled to link 12 to which a controlled voltage level for defining the operation of the delay circuit is applied. Input link 11 receives an input pulse. The controllable delay output pulse produced by the programmable delay circuit of FIG. 1 is defined relative to the input pulse.

Figure 1A:
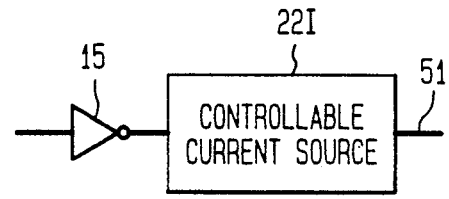
FIG. 1A shows a modification of a portion of FIG. 1.

The output of exclusive OR gate 13 is coupled over link 14 to an inverter 15, the output of which is coupled over link 21 to a resistor 22. Resistor 22 may be a variable resistor as shown by the arrow and forms one adjustable component of a timing pulse, generator including a time constant control circuit 50 Resistor 22 is coupled over link 51 to the input of a Schmitt trigger circuit 61. The second component of the time constant control circuit may comprise a capacitor 52, shown as being variable by the arrow through the capacitor, coupled between link 51 and a reference voltage terminal, such as ground. It is to be noted that the variable resistance and variable capacitance symbols shown in FIG. 1 are merely for schematic purposes. Resistor 22 may be a fixed resistor associated with a selected one of a set of different valued capacitors, and vice versa, in the course of an actual semiconductor chip implementation. What is important is that the components of which the time constant circuit 50 is comprised are controllable, so as to permit the rate of change of voltage on link 51 to be adjustable. In place of variable resistor 22, a controllable current source 22I, shown in FIG. 1A, may be substituted.

Where it is desired to effectively bypass the time constant control circuit so as to define a sharp leading or trailing edge of the timing pulse that is coupled over link 51 to Schmitt trigger 61, resistor 22 may be bypassed by the incorporation of a controlled switch for controllabling coupling one of the two voltage levels that define the binary states of the signals being processed directly to link 51.

For this purpose, as schematically shown in FIG. 1, a P channel MOSFET 23 may have its source drain path coupled between a positive voltage (+V) source terminal 32 and link 51. As shown in FIG. 1, MOSFET 23 has its source 32 coupled to receive a positive voltage +V and its drain 33 coupled to link 51. Gate 31 of MOSFET 23 is coupled to link 14 so as to receive the output of exclusive OR gate 13. MOSFET 23 is turned on when the voltage level on link 14 is low (e.g. ground) thereby coupling a positive voltage (+V) source terminal 32 and link 51.

Also schematically shown in FIG. 1 is an N Channel MOSFET 43, the gate 41 of which is coupled to link 14 and the source 42 of which is coupled to ground, corresponding to the second binary voltage level of the signals being processed. The drain 44 of MOSFET 43 is coupled to link 51. When the output of exclusive OR gate 13 goes high, the high voltage level on link 14 turns on N channel MOSFET 43, so that a low voltage level is applied to link 51.

By selectively incorporating one of MOSFETs 23 and 43 into the circuit, resistor 22 is effectively bypassed for the selected one of the leading and trailing edges of the timing signal that is coupled over link 51 and to which Schmitt trigger circuit 61 is to respond.

Schmitt trigger circuit 61 is triggered when the voltage level on link 51 reaches a threshold that is established by an internal voltage divider circuit of the Schmitt trigger circuit 61, to be described in detail below in conjunction with the description of FIG. 6. As schematically illustrated in FIG. 1, Schmitt trigger circuit 61 may be considered to have a hysteresis characteristic so that, once triggered, its output remains in a prescribed voltage state until the input returns to its previous voltage state. This prevents the output of the Schmitt trigger circuit 61 from oscillating in response to noise variations on link 51. The output of Schmitt trigger circuit 61 is coupled over link 62 to a second input of NAND gate 63. NAND gate 63 logically combines the input signal on link 11 with the timing pulse produced at the output of Schmitt trigger circuit 61 and produces a controlled delay pulse on link 64, the time of occurrence and duration of which is controlled by the settings of the time constant control circuit and the control voltage supplied to link 12 of exclusive OR gate 13. Link 64 may be coupled to suitable downstream inverter/driver circuit for a complement of the delayed output pulse as desired.

In order to facilitate an understanding of the operation of the programmable delay circuit device shown in FIG. 1, attention is now directed to FIGS. 2A-2F which show a timing diagram of voltage levels at prescribed points throughout the circuit shown in FIG. 1.

An exemplary input signal on link 11 is shown in FIG. 2 as having a leading edge 11LE and a trailing edge 11TE. In the present example, it will be assumed that it is desired to produce a pulse whose leading edge is delayed with respect to the leading edge 11LE of input signal 11 and whose trailing edge effectively terminates with the trailing edge 11TE of input signal 11.

Figure 2A:
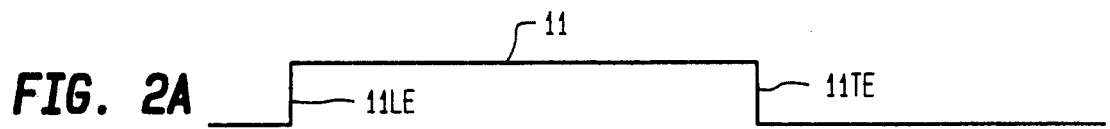
FIGS. 2A-2F and 3A-3F are timing diagrams of voltage levels occurring at prescribed points in the circuit shown in FIGS. 1.
Figure 2B:
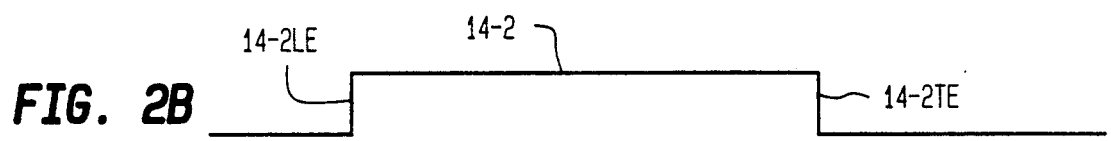

As pointed out previously, the characteristics of the delay pulse produced by the circuit shown in FIG. 1 are selectively controllable by setting the control voltage on input link 12 of exclusive OR gate 13 and the integration time constant of the time constant control circuit 50. In the present example, where it is desired to initiate the delayed pulse at a prescribed time subsequent to the leading edge 11LE of the input pulse 11 and to terminate the delayed pulse effectively coincident with the trailing edge 11TE of input pulse 11, the control voltage applied over link 12 is low (corresponding to binary 0). As a result the output of exclusive OR gate 13 on link 14 has the pulse characteristics shown by pulse 14-2 in FIG. 2B, wherein the leading edge 14-2LE is shown as being effectively coincident with the leading edge 11LE of input pulse 11 and the trailing edge of 14-2TE of which is effectively coincident with the trailing edge 11TE of input pulse 11. The minor delay between the respective edges shown in FIGS. 2A, 2B represents the minor signal propagation delay through the exclusive OR circuit 13. This delay is a fixed known delay and is considerably shorter than the intended variable delay to be produced by the programmability mechanism of the invention.

Figure 2C:
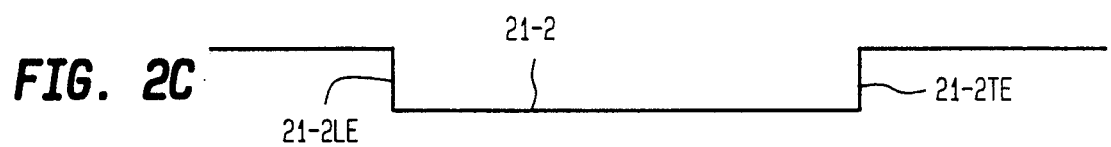

Pulse 14-2 on link 14 at the output of exclusive OR circuit 13 is employed to control the generation of a timing pulse the characteristics of which are controlled by time constant circuit 50. As shown in FIG. 2C, when coupled through inverter 15, pulse 14-2 is inverted into pulse 21-2 having leading edge 21-2LE and trailing edge 21-2TE. As noted previously, because of the propagation delay through the internal circuitry of the delay circuit (here through inverter 15) the leading and trailing edges of pulse 21-2 are delayed slightly with respect to the leading and trailing edges of pulse 14-2.

Ignoring, for the moment, the utilization of MOSFETs 23 and 43, pulse 21-2 at the output of inverter 15 encounters time constant control circuit 50 comprised of resistor 22 and capacitor 52. The inverter 15 and the time constant control circuit 50 produces, on link 51, a timing control pulse 51-2 shown in FIG. 2D. The leading edge 51-2LE of timing control pulse 51-2 has a gradual fall time from a high voltage level to a low voltage level defined by the RC time constant of resistor 22 and capacitor 52, assuming that the output resistance of inverter 15 is significantly less than the resistance of R22. Pulse 51-2 has a trailing edge 51-2TE which is also exponentially tapered, as governed by the time constant characteristics of resistors 22 and capacitor 52. When the voltage level of signal 51-2 reaches the threshold voltage set within Schmitt trigger 61, the output of Schmitt trigger 61 on link 62 changes state, as represented by the leading edge 62-2LE of pulse 62-2 shown in FIG. 2E. As shown therein, the voltage level on link 62 goes from a low state to a high state. The output of Schmitt trigger 61 remains at a high state until reset. Where Schmitt trigger circuit 61 is internally configured to respond to both positive-going and negative-going transitions at its input, its output on link 62 again changes state (from high to low) when the voltage on link 51, represented by the trailing edge 51-2TE of pulse 51-2 increases from its low level and crosses the threshold to which the Schmitt trigger circuit is set. At this point, Schmitt trigger 61 changes state, as shown at trailing edge 62-2TE.

Figure 2D:
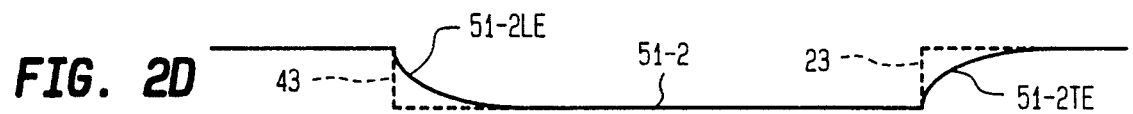
Figure 2E:
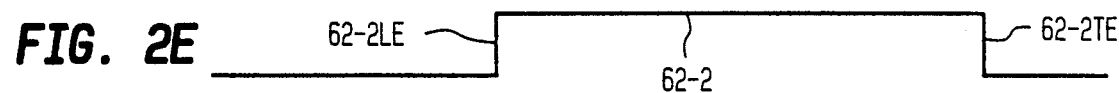
Figure 2F:

Pulse 62-2 is combined in NAND gate 63 with input pulse 11 on link 11 to produce output pulse 64-2 on link 64. Because the logical operation carried out on the output of Schmitt trigger 61 on link 62 and the input pulse on link 11 in a NAND operation, the leading edge 64-2LE of pulse 64-2 (going from a high state to a low state) is effectively coincident (except for internal circuit delay) with the leading edge 62-2LE of the output of the Schmitt trigger 61. Pulse 64-2 goes from a low state to a high state effectively coincident with the trailing edge of input pulse 11 (again taking into account the propagation delays through circuit, as noted above). Namely, as shown in FIG. 2F, the leading edge of the output delay pulse 64-2 produced by NAND gate 63 occurs at a time determined by the time constant circuit 50, which controls the triggering of Schmitt trigger circuit 61 relative to the leading edge 11LE of input pulse 11. The trailing edge 64-2TE of input pulse 64-2 is effectively coincident with the trailing edge 11TE of the input pulse 11, as noted above so that in this instance Schmitt trigger circuit 61 may be internally configured to respond to only a positive level-to-negative level-going voltage transition, e.g. as represented by leading edge 51-2LE of pulse 51-2, as shown in FIG. 2D. It is to be understood, however, that, in general, Schmitt trigger circuit 61 is internally configured to trigger on both positive and negative-going voltage swings on link 51.

As pointed out above where a complement of the pulse 64-2 is desired, output link 11 may be coupled to a downstream inverter (such as inverter 65) to produce a pulse which goes from a low state to a high state at a prescribed controllable delay time relative to the leading edge 11LE of input pulse 11 and whose trailing edge is effectively coincident with the trailing edge 11TE of input pulse 11. The delay time, namely the time between the leading edge 11LE of input pulse 11 and the leading edge 64-2LE of the delay pulse 64-2 on link 64 is controlled by the integration RC time constant of time constant control circuit 50 and the threshold voltage of Schmitt trigger circuit 61 which is preset.

As described above, by setting the control voltage on link 12 to a binary zero level, the programmable delay circuit of FIG. 1 produces an output pulse the leading edge of which is delayed with respect to the leading edge of the input pulse and the trailing edge of which is effectively coincident with the trailing edge of the input pulse. To obtain a complement of this delay function, it is simply a matter of changing the control voltage input level applied to link 12 of exclusive OR gate 13. As a result, the delay pulse control function described above with reference to FIGS 2A-2F may be effectively reversed; namely, the circuit shown in FIG. 1 may be controlled to produce a delay pulse whose leading edge is effectively coincident with the leading edge of the input pulse and whose trailing edge occurs at a controllable time, determined by the time constant circuit 50.

Figure 3A:
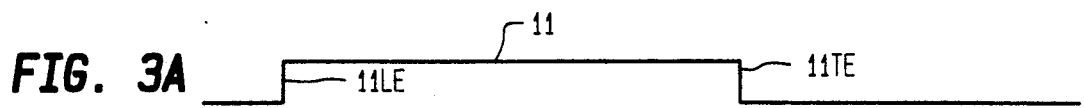
Figure 3B:
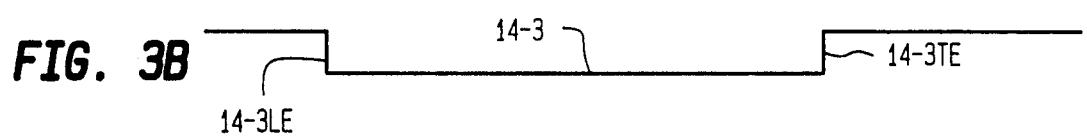
Figure 3C:
Figure 3D:
Figure 3E:
Figure 3F:
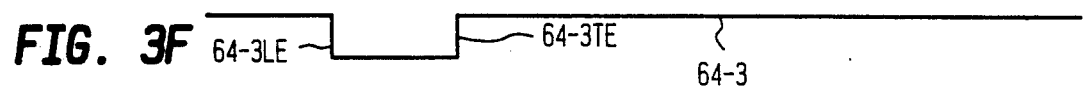

More particularly, referring to FIG. 3B, with the state of the control level on link 12 reversed from that shown in FIG. 2B, the output of exclusive OR gate 13 on line 14 has the pulse characteristic shown at 14-3. Leading edge 14-3LE of pulse 14-3 is effectively coincident with the leading edge 11LE of input pulse 11 (FIG. 3A) and its trailing edge 14-3TE is effectively coincident with the trailing edge of 11TE of input pulse 11 as shown. The output of inverter 15 on link 21 produces pulse 21-3 (FIG. 3C) which is effectively the complement of pulse 21-2 shown in FIG. 2C. Pulse 21-3 is applied to time constant circuit 50 to produce pulse 51-3 (FIG. 3D) which, from a comparison with FIG. 2D, is seen as a complement of pulse 51-2 therein. Consequently, Schmitt trigger 61 produces a pulse 62-3 (FIG. 3E) which is effectively a complement of pulse 62-2 shown in FIG. 2E. NAND gate 63 combines the input pulse on link 11 with the output pulse 62-3 from Schmitt trigger 61 to produce output pulse 64-3 shown in FIG. 3F as having leading edge 64-3LE and trailing edge 64-3TE. As shown therein, the leading 64-3LE of output pulse 64-3 is effectively coincident with the leading edge 11LE of input pulse 11 but its trailing edge 64-3TE occurs at a time delayed by the time constant of time circuit 50. As can be seen from a comparison of pulses 64-2 and 64-3 in FIGS. 2F and 3F, respectively, time constant circuit 50 controls the time of termination of pulse 64-3 in FIG. 3F, whereas it controls the time of initiation of the pulse 64-2 in FIG. 2F.

Figure 4A:
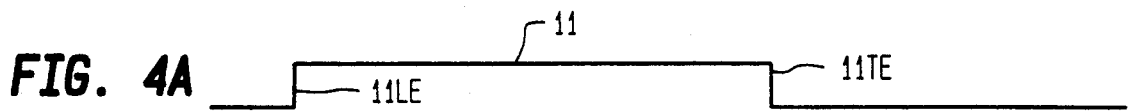
Figure 4B:
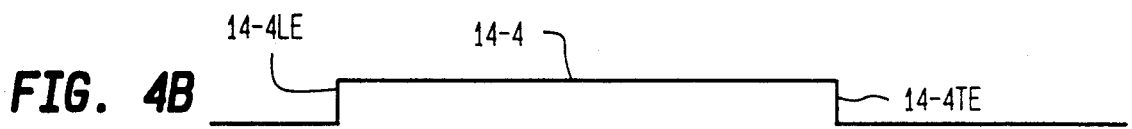
Figure 4C:
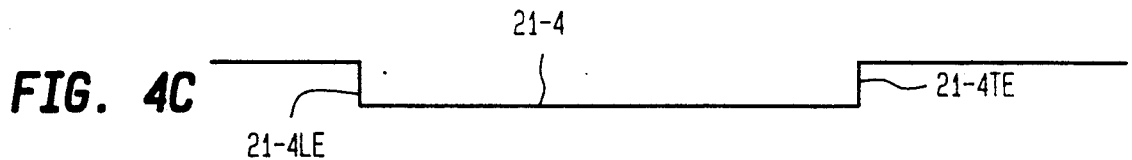
Figure 4D:
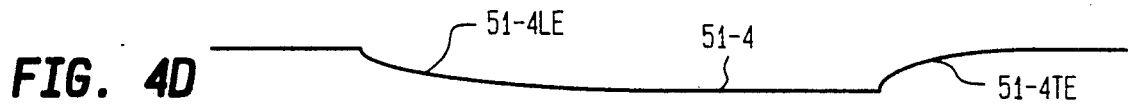
Figure 4E:
Figure 4F:
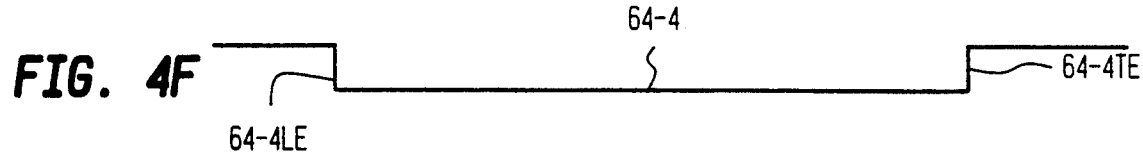

In the timing diagrams of the embodiment of the invention shown in FIG. 1, it was observed that the effective timing control mechanism provided by time constant circuit 50 operated on the leading edge of the timing pulse coupled over link 51. Control of the delay pulse using the trailing edge may be accomplished by replacing NAND gate 63 with a NOR gate. In this circumstance, the resulting circuit operation is as shown in FIGS. 4A-2F and 5A-5F, respectively, where the control voltage applied to control link 12 of exclusive OR gate 13 corresponds to the control voltage applied for the operations illustrated in FIGS. 2A-2F and 3A-3F, respectively. As shown in FIG. 4F, the leading edge 64-4LE of the output pulse 64-4 is effectively coincident with the leading edge 11LE of input pulse 11 (FIG. 4A), but the trailing edge 64-4TE is delayed with respect to the trailing edge 11TE of the input pulse by the integration time constant of time constant circuit 50 which controls the rate at which the timing pulse 51-4 (FIG. 4D) on link 51 recovers to its original state, namely the rate at which its trailing edge 51-4TE reaches the threshold of Schmitt trigger circuit 61.

Conversely, when the control voltage on link 12 is reversed, as shown in FIG. 5B, output pulse 64-5 (FIG. 5F) on link 64 has its leading edge 64-5LE effectively coincident with the trailing edge 11TE of input pulse 11, but its trailing edge 64-5TE delayed by the integration time constant of circuit 50 acting on pulse 51-5 on link 51.

As pointed out previously, where it is desired to bypass the effective time constant circuit 50, one of the bypass transistors 23 and 43 may have its gate connected to link 14 at the output of exclusive OR circuit 13. As shown for pulse 51-2 in FIG. 2D, connecting the gate 41 of N channel MOSFET 43 to link 14 causes transistor 43 to become enabled at the leading edge 21-2LE of pulse 21, so that the leading edge of pulse 51-2 has a sharp transition as shown at 51-43. Conversely, connecting end P channel MOSFET 23 causes the trailing edge of pulse 51-2 to have a sharp transition as shown in at in FIG. 2D.

Although, in the embodiment shown in FIG. 1, capacitor 52 is shown as being connected to ground (OV), it may be connected to the opposite binary state-representative voltage polarity (+V). Moreover, exclusive OR circuit 13 may be replaced by an exclusive NOR circuit with a change in controllable voltage levels. Also, as noted previously, inverter 15 and resistor 22 at the front end of the time constant control circuit may be replaced by a controlled current source. In the embodiment shown in FIG. 1, the output impedance of inverter 15 is small with respect to the value of resistance 22; the time constant is primarily determined by the product of the resistance of resistor 22 and the capacitance of capacitor 52 (including any parasitics on link 51.)

Figure 6:
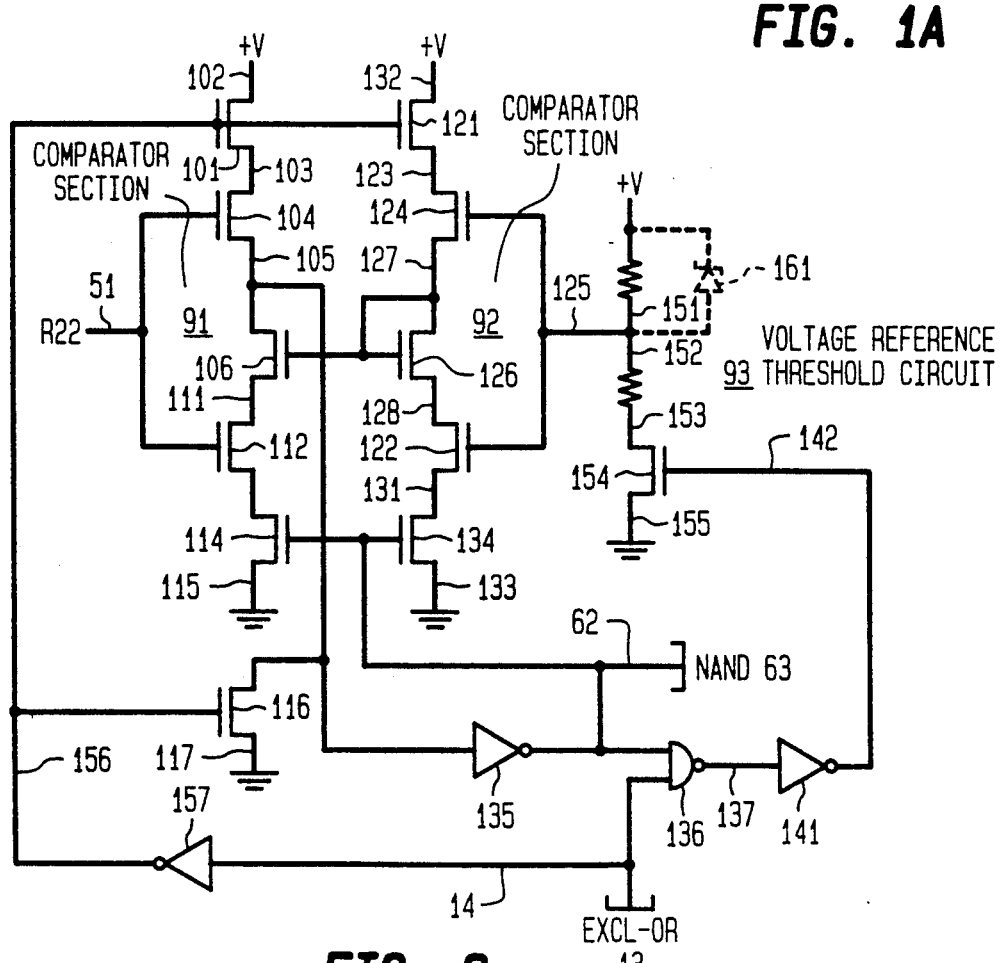
FIG. 6 is a diagrammatic illustration of a preferred embodiment of a Schmitt trigger circuit employed in the programmable delay circuit shown in FIG. 1.

Referring now to FIG. 6, there is illustrated a detailed circuit diagram of an embodiment of a Schmitt trigger 61 that may be employed in the programmable delay circuit of FIG. 1, described above. For purposes of present description, the circuit is configured to be threshold sensitive to positive-to-negative going voltage swings (e.g. response to the leading edge 51-2LE of pulse 51-2 produced by time constant control circuit 50 in response to input pulse 11 and control voltage 14-2 for the set of timing diagrams shown in FIGS. 2A-2F. It is to be understood however, that the voltage level fluctuation immunity of the configuration shown in FIG. 6 may be incorporated into a Schmitt trigger circuit of opposite (negative-to-positive) voltage swing sensitivity or dual sensitivity. The polarities for FIG. 6 have been chosen to simplify the circuit diagram and its accompanying description.

As mentioned previously, the configuration of the Schmitt trigger circuit 61 shown in FIG. 6 has the advantage of being effectively immune to variations in power supply voltage. More particularly, the Schmitt trigger circuit is comprised of a pair of differentially intercoupled comparator sections (or arms) 91 and 92 and a voltage reference threshold circuit 93. Comparator section 91 is comprised of a pair of P channel MOSFETs 101 and 104 having their source-drain paths connected in series between a high voltage (+V) terminal 102 and link 105. The gate of P-channel MOSFET 101 is coupled via link 156 to the output of inverter 157, which is coupled to link 14. The gate of P channel MOSFET 104 is coupled in common with the gate of an N channel MOSFET 112 to link 51. N channel MOSFET 112 has its source-drain current flow path coupled in series with the source-drain current flow path of an N channel MOSFET 106 and an N channel MOSFET 114.

N channel MOSFET 114 has its source connected to the low voltage level (ground) via link 115, whereas N channel MOSFET 106 has its drain connected over link 105 to the drain of P channel MOSFET 104. The gate of N channel MOSFET 106 is coupled over link 127 to the gate of a corresponding N channel MOSFET 126 in comparator section 92. Link 127 also couples the drain of MOSFET 126 in common with its gate and to the drain of a P channel MOSFET 124. P channel MOSFET 124 has its source coupled over link 123 to the drain of a P channel MOSFET 121, the source of which is coupled to a positive supply voltage terminal 132. The gate of P channel MOSFET 121 is coupled to link 157.

The source of N channel MOSFET 126 is coupled over link 128 to the drain of N channel MOSFET 122. The source of N channel MOSFET 122 is coupled over link 131 to the drain of N channel MOSFET 134, the source of which is coupled over link 133 to a low voltage terminal (ground). Link 62 couples the gates of each of N channel MOSFETs 114 and 134 to one another and to an output link of the Schmitt trigger circuit, corresponding to link 62 in FIG. 1. The gate of each of P channel MOSFET 124 and N channel MOSFET 122 is coupled over link 125 to the junction between voltage divider resistors 151 and 152 of a voltage threshold reference circuit 93. Resistors 151 and 152 are coupled in series between a high voltage level terminal +V and the drain of an N channel MOSFET 154, the source of which is coupled over link 155 to a low voltage terminal (ground). The gate of N channel MOSFET 154 is coupled over link 142 to the output of an inverter driver 141, the input of which is coupled to the output of a NAND gate 136. One input of NAND gate 136 is coupled to output link 62. Output link 62 is coupled to the output of an inverter 135, the input of which is coupled to link 105. A second input of NAND gate 136 is coupled to link 14 at the output of exclusive OR circuit 13 ( shown in FIG. 1).

As is conventional practice in the integrated circuit architectural configurations of balanced differential comparator circuits, MOSFETs 101-121, 104-124, 106-126, 112-122 and 114-134 are respectively effectively matched with each other. An additional control N-channel MOSFET 116 has its gate coupled to link 156, its source coupled over link 117 to ground and its drain coupled to link 105.

In operation, it is initially assumed that the output of exclusive OR circuit 13 (FIG. 1) is at a low level and goes to a high level, as shown, for example, at pulse 14-2 in FIG. 2. At this time, capacitor 52 has been charged to the high level representative voltage +V and is to be discharged through resistor 22 as the output of inverter 15 goes from a high state to a low state. Namely, prior to the low-to-high transition on link 14, the output of inverter 15 on link 21 is at a high voltage level and goes to a low level on the transition.

Because the output of exclusive OR circuit 13 on link 14 is initially low, the output 137 of NAND gate 136 is initially high, so that the output of inverter 141 on link 142 is low, thereby disabling N-channel MOSFET 154. There is no current drawn through the voltage divider network consisting of resistors 151 and 152, so that the potential applied to threshold input link 125 corresponds to the high level voltage +V to which resistor 151 is coupled. P-channel MOSFETs 101 and 121 have been disabled by the high voltage level on link 156, whereas N-channel MOSFET 116 has been enabled and couples its source voltage (ground) to link 105 which causes inverter 135 to produce a high level voltage on output link 62. The high level output of inverter 135 has also been enabling N-channel MOSFETs 114 and 134, so that a low level voltage is applied at the drains thereof, 113 and 131, respectively. It is to be noted that N-channel MOSFET 122 has also been turned on because of the application of a high level voltage (+V) on threshold input link 125, so that there is a low level voltage coupled over link 128 to the source of N-channel MOSFET 126.

When the voltage level on link 14 at the output of exclusive OR gate 13 changes state from a low level to a high level, the high voltage level on link 156 changes from a high level to a low level, thereby turning on P-channel MOSFETs 101 and 121, and thereby causing a high level voltage to be coupled over links 103 and 123 to the source-drain path P-channel MOSFETs 104 and 124. At the same time, with the voltage level on link 14 going from a low state to a high state, output 137 of NAND gate 136 changes from a high state to a low state, causing the output 142 of inverter 141 to go from a low state to a high state, thereby turning on N-channel MOSFET 154. When N-channel MOSFET 154 turns on, the interruption of the connection between high level voltage source (+V) and the low level voltage source (ground) across the voltage divider network consisting of resistors 151 and 152 is terminated, so that current flows through the voltage divider network and the voltage level on threshold coupling link 125 drops to the value established by the voltage divider network. This value sets the conductance level of MOSFETs 124 and 122, establishing a voltage division thereacross and causing a prescribed positive voltage to be coupled over link 127 to the commonly connected gates of N channel MOSFETs 106 and 126, which now conduct to the degree defined by the voltage on link 125 from reference threshold voltage circuit 93.

The low voltage level on link 156 turns off N-channel MOSFET 116; however, the conductance setting of N-channel MOSFET 106 in accordance with the voltage level applied over link 127 is sufficient to maintain a low voltage on link 105 and thereby maintain a high voltage level on output link 62.

As capacitor 52 discharges, the voltage level on link 51 decreases. When the level of the voltage level on link 51 corresponds to the threshold voltage applied to link 125, causing the degree of conductance of N-channel MOSFET 112 to have decreased to that corresponding to N-channel MOSFET 122 and that of P-channel MOSFET 104 to have increased to correspond to that of P-channel MOSFET 124, the voltage level on link 105 goes high, causing the output of inverter of 135 to go low. When the output of inverter 135 goes low, output link 62 coupled thereto goes low. The low voltage output of inverter 135 causes the output 137 of NAND gate 136 to go high, so that the output 142 of inverter 141 goes low, thereby turning off N-channel MOSFET 154 and interrupting the flow of current through the voltage divider network. The voltage level on link 125 reverts to the high voltage level supplied through resistor 151 from high level source (+V).

The low level voltage output on link 62 turns off N-channel MOSFETs 114 and 134, so that the Schmitt trigger returns to a low power state. The Schmitt trigger circuit remains in the state wherein its output is in a low condition until the output of exclusive OR circuit 13 on link 14 changes state. When link 156 changes state from a low state to a high state, P-channel MOSFETs 101 and 121 are turned off so that a high voltage level is no longer applied over link 105. Instead, with N-channel MOSFET 116 being turned on by the high voltage on link 156, link 105 is at a low level, causing the output of inverter 135 to go high so that the output of the Schmitt trigger circuit reverts to its previous (high) state.

Because the comparator sections 91 and 92 and the reference threshold section 93 of Schmitt trigger circuit 61 are coupled across the same set of supply voltages that establish the binary high and low levels of the digital signal processing system, the delay circuit is not affected by voltage fluctuations. Both the switching threshold established by voltage divider resistors 151 and 152 and the RC time constant of time constant control circuit 50 are referenced to the same voltage differential, regardless of any fluctuation in the magnitude of that differential. Consequently, the delay circuit operates independently of variations in the supply voltage.

If the time constant control circuit 50 were composed of a constant current source from the positive supply instead of resistor 22, then resistor 151 shown in FIG. 6 would be replaced by a voltage source referenced to the positive supply voltage. One such voltage reference could be derived from a zener diode 161 shown in dotted lines in FIG. 6. The constant current source would cause the voltage on link 51 to change at a rate linear with time. The fixed reference voltage would again make the circuit operation independent of supply voltage variations.

In addition, as noted previously, since the delay mechanism of the timing pulse generator or time constant control circuit 50 is composed of passive (RC) elements, the delay circuit is effectively immune to wafer processing variations that impact transistor electronic parameters wafer variations in the magnitude of passive elements could be minimized by trimming the resistor, capacitor of both via a laser or other known methods. External passive elements or both could also be employed.

While I have shown and described an embodiment in accordance with the present invention, it is to be understood that the same is not limited thereto but is susceptible to numerous changes and modifications as known to a person skilled in the art, and I therefore do not wish to be limited to the details shown and described herein but intend to cover all such changes and modifications as are obvious to one of ordinary skill in the art.

What is claimed:

1. A circuit for generating an output pulse at least one characteristic of which is controllably defined relative to an input pulse comprising:
 a first input to which said input pulse is applied;
 a second input to which a control input is applied;
 first means, coupled to said first and second inputs, for producing a first pulse in accordance with said input pulse and said control input; and
 second means, coupled to said first input and to said first means, for generating an output pulse characteristics of which are established in accordance with said first pulse and said input pulse.

2. A circuit according to claim 1, wherein said first means comprises means for generating a timing pulse having a leading edge portion and a trailing edge portion and including means for controlling the time constant of at least one of said leading and trailing edge portions, and means for generating said first pulse in accordance with prescribed characteristics of at least one of the leading and trailing edge portions of said timing pulse.

3. A circuit according to claim 2, wherein said time constant controlling means includes a controlled current source-capacitor circuit.

4. A circuit according to claim 2, wherein said time constant controlling means includes an adjustable resistor-capacitor circuit.

5. A circuit according to claim 2, wherein said first pulse generating means comprises a Schmitt trigger circuit coupled in circuit with said timing pulse generating means and said second means.

6. A circuit according to claim 2, wherein said circuit is comprised of CMOS circuit components.

7. A circuit according to claim 5, wherein said time constant controlling means includes a controlled current source-capacitor circuit.

8. A circuit according to claim 5, wherein said time constant controlling means includes an adjustable resistor-capacitor network.

9. A circuit according to claim 2, wherein said first means comprises means for logically combining said input pulse and said control input and deriving therefrom a timing pulse having prescribed leading and trailing edge characteristics.

10. A circuit according to claim 9, wherein said time constant controlling means includes a programmable time constant circuit for setting the characteristics of the leading and trailing edges of said timing pulse.

11. A circuit according to claim 10, wherein said first pulse generating means comprises a Schmitt trigger circuit coupled in circuit with said timing pulse generating means and said second means.

12. A circuit according to claim 10, wherein said timing pulse generating means comprises means for coupling a logic level representative voltage to said programmable time constant circuit in accordance with a logically combining of said input pulse and said control input.

13. A circuit according to claim 2, wherein said timing pulse generating means comprises means for sequentially coupling first and second voltages to said first pulse generating means in accordance with the logical combination of said input pulse and said control input.

14. A circuit according to claim 13, wherein said time constant controlling means comprises means for controlling the rate of change of the leading and trailing edges said timing pulse.

15. A circuit according to claim 14, wherein said rate of change controlling means includes a programmable time constant circuit coupled in circuit with said sequentially coupling means and said first pulse generating means.

16. A circuit according to claim 15, wherein said rate of change controlling means comprises means for controllably applying one of said first and second voltages to said first pulse generating means and effectively bypassing said programmable time constant circuit.

17. A circuit according to claim 16, wherein said controllably applying means includes a switch coupled between a terminal to which one of said first and second voltages is coupled and said first pulse generating means and controllably enabled by the logical combination of said control input and said input signal.

18. A circuit according to claim 17, wherein said first means comprises an exclusive operation logic circuit one input of which is coupled to said first input and another input of which is coupled to said second input, and an output of which is coupled to said rate of change controlling means.

19. A circuit according to claim 2, wherein said second means comprises means for logically combining said first pulse and said input pulse to generate said output pulse.

20. A circuit according to claim 2, wherein said time constant controlling means comprises means for controlling the rate of change of at least one of the leading and trailing edge portions of said timing pulse.

21. A circuit according to claim 20, wherein said timing pulse generating means comprises means for sequentially coupling first and second voltages to said first pulse generating means in accordance with the logical combination of said input pulse and said control input.

22. A circuit according to claim 21, wherein said rate of change controlling means includes a programmable time constant circuit coupling in circuit with said sequentially coupling means and said first pulse generating means.

23. A circuit according to claim 22, wherein said rate of change controlling means comprises means for controllably applying one of said first and second voltages to said first pulse generating means and effectively bypassing said programmable time constant circuit.

24. A circuit according to claim 2, wherein said circuit is comprised of CMOS circuit components.

25. A circuit according to claim 2, wherein said first pulse generating means comprises a comparator circuit having first and second threshold circuit arms intercoupled between first and second comparator inputs and a comparator output, said first comparator input coupled to receive said timing pulse and said second comparator input coupled to receive a reference voltage level for establishing a level at which said timing pulse causes a level at the comparator output to change from a first state to a second state, and means for applying said reference voltage level to said second comparator input in response to a control input and for applying a first voltage to said second comparator input in response to said timing pulse reaching a voltage level corresponding to said reference voltage level.

26. A circuit according to claim 25, wherein said applying means comprises a voltage divider circuit controllably coupled between first and second voltage sources, and means, responsive to said control input, for causing said voltage divider circuit to be electrically connected in circuit with said first and second voltage sources whereby said voltage divider circuit applies said reference voltage level to said second input of said comparator circuit.

27. A circuit according to claim 26, wherein each of said first and second intercoupled threshold circuit arms of said comparator circuit are coupled in circuit between said first and second voltage sources.

28. A circuit according to claim 27, which is comprised of CMOS circuit components.

29. A circuit according to claim 26, wherein said causing means includes means for interrupting the electrical circuit connection between said voltage divider and said first and second voltage sources in response to the output of said comparator changing from said first state to said second state.

30. A circuit according to claim 29, further including means for causing the output of said comparator to change from said second state to said first state in response to a prescribed change in the level of said control input, while maintaining the interruption of the electrical circuit connection between said voltage divider and said first and second voltage sources.

31. A circuit device comprising:
a comparator circuit having first and second threshold circuit arms intercoupled between first and second inputs and an output, said first input being coupled to receive an input signal and said second input being coupled to receive a reference voltage level for establishing a level at which said input signal causes a voltage level at said output to change from a first state to a second state; and
means for applying said reference voltage level to said second input in response to the output of said comparator and a control input exclusive of the output of said comparator and for applying a first voltage to said second input in response to said input signal reaching a voltage level corresponding to said reference voltage level.

32. A circuit device according to claim 31, wherein said applying means comprises a voltage divider circuit controllably coupled between first and second voltage sources, and means, responsive to said control input, for causing said voltage divider circuit to be electrically connected in circuit with said first and second voltage sources, whereby said voltage divider circuit applies said reference voltage level to said second input of said comparator circuit.

33. A circuit device according to claim 32, wherein each of said first and second intercoupled threshold circuit arms of said comparator circuit are coupled in circuit between said first and second voltage sources.

34. A circuit device according to claim 32, wherein said causing means includes means for effectively interrupting the electrical circuit connection between said voltage divider and said first and second voltage sources in response to the output of said comparator changing from said first state to said second state.

35. A circuit device according to claim 34, further including means for causing the output of said comparator to change from said second state to said first state in response to a prescribed change in the level of said control input, while maintaining the interruption of the electrical circuit connection between said voltage divider and said first and second voltage sources.

36. A circuit device according to claim 35, which is comprised of CMOS circuit components.

37. An interface circuit comprising:
a comparator circuit having first and second complementary field effect transistor inverter circuit arms each being coupled between first and second supply voltage terminals and coupled to an output terminal, said first inverter circuit arm having a first input terminal to which an input signal is applied, and said second inverter circuit arm having a second input terminal to which a reference voltage is applied for establishing a voltage level at which said input signal causes a voltage level at said output terminal to change from a first level to a second level;
first means, coupled to said second input terminal of said second inverter circuit arm, for controllably supplying said reference voltage to said second input terminal; and
second means, coupled to said comparator circuit and said first means and having a control terminal to which a control signal exclusive of the output of said comparator is applied, for causing a first, operational current flow condition to be established in said comparator circuit and said first means in response to the application of said control signal and, upon the voltage level at said output terminal changing from said first level to said second level, for causing a second, quiescent current flow condition to be established in said comparator circuit and said first means.

38. An interface circuit according to claim 37, wherein said first means comprises a voltage divider coupled in series with a controlled switching device between said first and second supply voltage terminals, a voltage divider being coupled to said reference terminal and said switching device being coupled to said control terminal, said controlled switching device being rendered conductive by the application of said control signal to said control terminal and non-conductive in response to the voltage level at said output terminal changing from said first level to said second level.

* * * * *